United States Patent
Li et al.

(10) Patent No.: US 11,037,515 B2
(45) Date of Patent: Jun. 15, 2021

(54) SHIFT REGISTER UNIT AND METHOD FOR CONTROLLING THE SAME, GATE DRIVING CIRCUIT, DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Meng Li, Beijing (CN); Ying Wang, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 138 days.

(21) Appl. No.: 16/312,890

(22) PCT Filed: Jan. 5, 2018

(86) PCT No.: PCT/CN2018/071524
§ 371 (c)(1),
(2) Date: Dec. 21, 2018

(87) PCT Pub. No.: WO2018/201750
PCT Pub. Date: Nov. 8, 2018

(65) Prior Publication Data
US 2019/0221181 A1    Jul. 18, 2019

(30) Foreign Application Priority Data

May 4, 2017 (CN) .......................... 201710310290.3

(51) Int. Cl.
*G11C 19/00* (2006.01)
*G09G 3/36* (2006.01)
(Continued)

(52) U.S. Cl.
CPC ............. *G09G 3/3677* (2013.01); *G09G 3/20* (2013.01); *G11C 19/28* (2013.01); *G11C 19/287* (2013.01);
(Continued)

(58) Field of Classification Search
None
See application file for complete search history.

(56) References Cited

U.S. PATENT DOCUMENTS

| 8,054,935 B2 * | 11/2011 | Tsai | ...................... H03K 19/096 377/64 |
| 2011/0216875 A1 * | 9/2011 | Miyake | .................... G09G 3/20 377/75 |

(Continued)

FOREIGN PATENT DOCUMENTS

| CN | 104835476 A | 8/2015 |
| CN | 105047163 A | 11/2015 |

(Continued)

OTHER PUBLICATIONS

International Search Repent and Written Opinion issued in International Patent Application No. PCT/CN2018/071524; dated Mar. 26, 2018.

(Continued)

*Primary Examiner* — Tuan T Lam
(74) *Attorney, Agent, or Firm* — McDermott Will and Emery LLP

(57) ABSTRACT

A shift register unit includes a shift drive sub-circuit, storing a voltage of a signal input terminal or outputting a voltage of a second clock signal terminal to a first signal output signal; an output sub-circuit, outputting a voltage of a first voltage terminal to a second signal output terminal; a pull-down sub-circuit, pulling down voltages of the first (Continued)

signal output terminal and the second signal output terminal to a second voltage terminal and a third voltage terminal.

14 Claims, 7 Drawing Sheets

(51) Int. Cl.
*G11C 19/28* (2006.01)
*G11C 29/00* (2006.01)
*G09G 3/20* (2006.01)

(52) U.S. Cl.
CPC ... *G11C 29/702* (2013.01); *G09G 2310/0286* (2013.01); *G09G 2310/08* (2013.01); *G09G 2330/08* (2013.01); *G11C 29/824* (2013.01)

(56) References Cited

U.S. PATENT DOCUMENTS

| | | | | |
|---|---|---|---|---|
| 2015/0317954 A1* | 11/2015 | Jang | ................. | G09G 3/20 345/213 |
| 2015/0318052 A1* | 11/2015 | Li | ................. | G11C 19/28 377/64 |
| 2016/0358666 A1 | 12/2016 | Pang | | |
| 2016/0372034 A1 | 12/2016 | Zhou | | |
| 2016/0372069 A1* | 12/2016 | Lv | ................. | G09G 3/36 |
| 2018/0301100 A1* | 10/2018 | Li | ................. | G09G 3/3674 |
| 2020/0043393 A1* | 2/2020 | Feng | ................. | G09G 3/20 |

FOREIGN PATENT DOCUMENTS

| | | |
|---|---|---|
| CN | 106067325 A | 11/2016 |
| CN | 106328042 A | 1/2017 |
| CN | 106448594 A | 2/2017 |
| CN | 106486049 A | 3/2017 |
| CN | 106887217 A | 6/2017 |
| KR | 2009-0072884 A | 7/2009 |

OTHER PUBLICATIONS

The first Office Action issued in Chinese Patent Applicaiton No. 201710310290.3, dated Apr. 25, 2018, with partial English translation.

Second Office Action issued in Chinese Patent Applicaiton No. 2017103102903, dated Nov. 7, 2018; with partial English translation.

Refusal Decision issued in Chinese Patent Application No. 201710310290.3, dated Mar. 14, 2019; with English translation.

* cited by examiner

SHIFT REGISTER UNIT AND METHOD FOR CONTROLLING THE SAME, GATE DRIVING CIRCUIT, DISPLAY DEVICE

CROSS-REFERENCE TO RELATED APPLICATION

This application is a national phase entry under 35 USC 371 of International Patent Application No. PCT/CN2018/071524 filed on 15 Jan. 2018, which claims priority to Chinese Patent Application No. 201710310290.3, filed on May 4, 2017, titled "SHIFT REGISTER UNIT AND METHOD FOR CONTROLLING THE SAME, GATE DRIVING CIRCUIT, DISPLAY DEVICE", which are incorporated herein by reference in their entirety.

TECHNICAL FIELD

The present disclosure relates to the field of display technologies, and more particularly, to a shift register unit and a method for controlling the same, a gate driving circuit, and a display device.

BACKGROUND

An array substrate is arranged in a display device such as a Thin Film Transistor Liquid Crystal Display (TFT-LCD), and the array substrate can be divided into a display area and a peripheral area surrounding the display area. There is a gate driver for scanning the gate lines line by line in the peripheral area. A Gate Driver on Array (GOA) design is generally adopted in the existing gate driver to integrate the Thin Film Transistor (TFT) gate switch circuit in the above peripheral area to form a GOA circuit, thereby achieving a design of narrow bezel.

SUMMARY

Embodiments of the present disclosure adopt the following technical solutions:

A first aspect of embodiments of the present disclosure provides a shift register unit, including a shift drive sub-circuit, a pull-down sub-circuit and an output sub-circuit. The shift drive sub-circuit is coupled to a signal input terminal, a first clock signal terminal, a second clock signal terminal and a first signal output terminal, and the shift drive sub-circuit is configured to store a voltage of the signal input terminal under a control of the first clock signal terminal, or to output a voltage of the second clock signal terminal to the first signal output terminal under a control of the signal input terminal, the first clock signal terminal, and the second clock signal terminal. The output sub-circuit is coupled to the first signal output terminal, a first voltage terminal and a second signal output terminal, and the output sub-circuit is configured to output a voltage of the first voltage terminal to the second signal output terminal under a control of the first signal output terminal. The pull-down sub-circuit is coupled to the first clock signal terminal, a second voltage terminal, a third voltage terminal, the first signal output terminal and the second signal output terminal, and the pull-down sub-circuit is configured to pull down voltages of the first signal output terminal and the second signal output terminal to the second voltage terminal and the third voltage terminal respectively under the control of the first clock signal terminal. An amplitude of a voltage output from the second voltage terminal is higher than an amplitude of a voltage output from the third voltage terminal.

Optionally, the shift drive sub-circuit includes a first transistor, a second transistor, a third transistor, a fourth transistor and a capacitor. A gate of the first transistor is coupled to the first clock signal terminal, a first electrode of the first transistor is coupled to the signal input terminal, and a second electrode of the first transistor is coupled to a second electrode of the second transistor. A gate of the second transistor is coupled to the first clock signal terminal, and a first electrode of the second transistor is coupled to a gate of the fourth transistor. A gate of the third transistor is coupled to the gate of the fourth transistor, a first electrode of the third transistor is coupled to the second clock signal terminal, and a second electrode of the third transistor is coupled to the second electrode of the first transistor. A first electrode of the fourth transistor is coupled to the second clock signal terminal, and a second electrode of the fourth transistor is coupled to the first signal output terminal. One end of the capacitor is coupled to the gate of the fourth transistor, and another end of the capacitor is coupled to the second electrode of the fourth transistor.

Optionally, the shift register unit further includes a repair sub-circuit. The repair sub-circuit is coupled to the signal input terminal, the first clock signal terminal, the second clock signal terminal and the first signal output terminal. The repair sub-circuit is configured to output a voltage of the second clock signal terminal to the first signal output terminal under a control of the signal input terminal, the first clock signal terminal and the second clock signal terminal.

Optionally, the repair sub-circuit includes a fifth transistor and a sixth transistor. A gate of the fifth transistor is coupled to the first clock signal terminal, a first electrode of the fifth transistor is coupled to the signal input terminal, and a second electrode of the fifth transistor is coupled to a gate of the sixth transistor. A first electrode of the sixth transistor is coupled to the second clock signal terminal, and a second electrode of the sixth transistor is coupled to the first signal output terminal. In a case where the shift drive sub-circuit includes the fourth transistor, a width to length ratio of each of the fifth transistor and the sixth transistor is 18% to 22% or approximately 18% to 22% of a width to length ratio of the fourth transistor.

Optionally, the pull-down sub-circuit includes a seventh transistor and an eighth transistor. A gate of the seventh transistor is coupled to the first clock signal terminal, a first electrode of the seventh transistor is coupled to the first signal output terminal, and a second electrode of the seventh transistor is coupled to the second voltage terminal. A gate of the eighth transistor is coupled to the first clock signal terminal, a first electrode of the eighth transistor is coupled to the second signal output terminal, and a second electrode of the eighth transistor is coupled to the third voltage terminal.

Optionally, the output sub-circuit includes a ninth transistor. A gate of the ninth transistor is coupled to the first signal output terminal, a first electrode of the ninth transistor is coupled to the first voltage terminal, and a second electrode of the ninth transistor is coupled to the second signal output terminal.

A second aspect of embodiments of the present disclosure provides a gate driving circuit, including a plurality of cascaded shift register units according to any one of those in the first aspect. A signal input terminal of a first stage of shift register unit is coupled to a start signal terminal. Except the first stage of shift register unit, a first signal output terminal of a previous stage of shift register unit is coupled to a signal input terminal of a next stage of shift register unit.

A third aspect of embodiments of the present disclosure provides a display device, including the gate driving circuit according to the second aspect.

A fourth aspect of embodiments of the present disclosure provides a method for driving any one of the shift register units according to the first aspect. In one image frame, the method includes: in a first period, storing, by the shift drive sub-circuit, a voltage of the signal input terminal under the control of the first clock signal terminal; pulling down, by the pull-down sub-circuit, voltages of the first signal output terminal and the second signal output terminal to the second voltage terminal and the third voltage terminal respectively under the control of the first clock signal terminal; wherein the amplitude of the voltage output from the second voltage terminal is higher than the amplitude of the voltage output from the third voltage terminal; in a second period, outputting, by the shift drive sub-circuit, a voltage of the second clock signal terminal to the first signal output terminal under the control of the signal input terminal, the first clock signal terminal and the second clock signal terminal; outputting, by the output sub-circuit, a voltage of the first voltage terminal to the second signal output terminal under the control of the first signal output terminal; and in a third period, pulling down, by the pull-down sub-circuit, voltages of the first signal output terminal and the second signal output terminal to the second voltage terminal and the third voltage terminal respectively under the control of the first clock signal terminal.

Optionally, in a case where the shift register unit further includes a repair sub-circuit, in the second period, the method further includes: outputting, by the repair sub-circuit, a voltage of the second clock signal terminal to the first signal output terminal under the control of the signal input terminal, the first clock signal terminal and the second clock signal terminal.

BRIEF DESCRIPTION OF THE DRAWINGS

In order to describe technical solutions in embodiments of the present disclosure or in the prior art more clearly, the accompanying drawings to be used in the description of embodiments or the prior art will be introduced briefly. Obviously, the accompanying drawings to be described below are merely some embodiments of the present disclosure, and a person of ordinary skill in the art can obtain other drawings according to those drawings without paying any creative effort.

DETAILED DESCRIPTION

Figure 1:
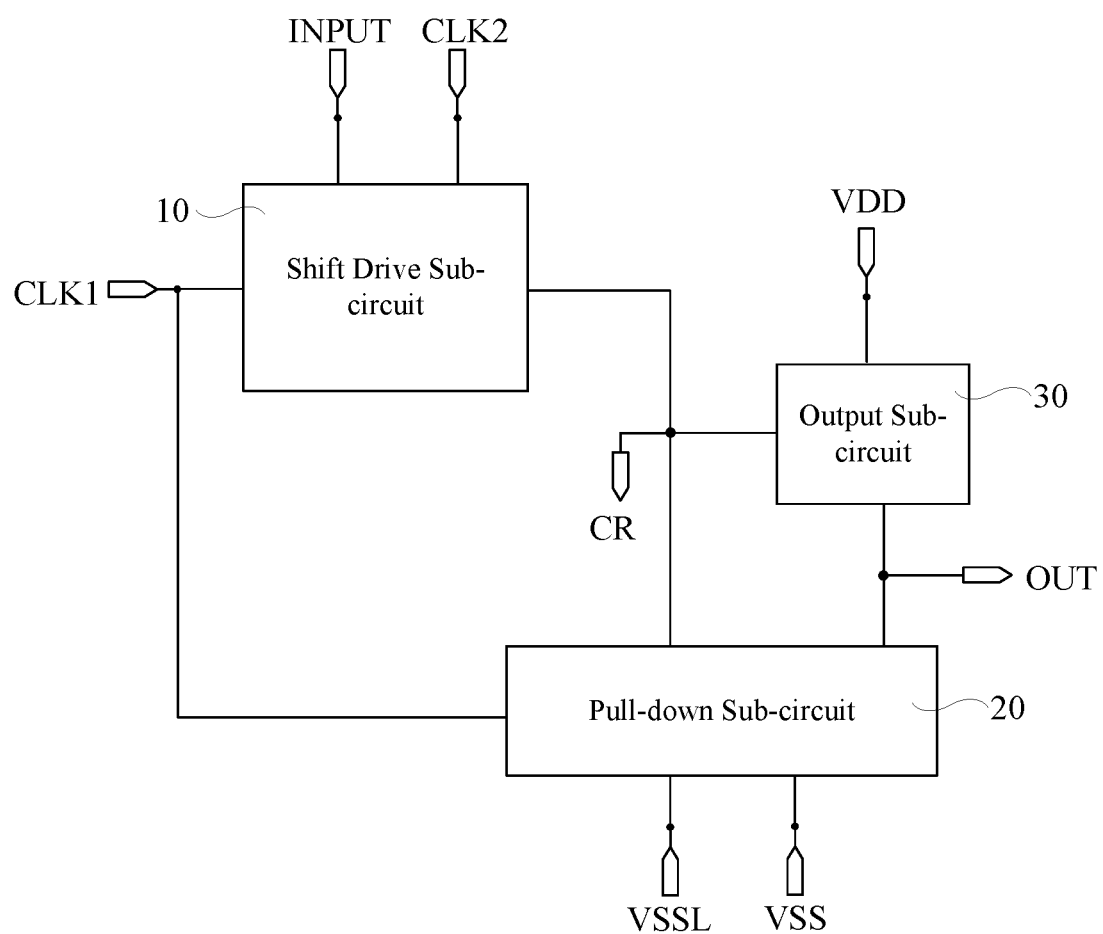
FIG. 1 is a schematic structural diagram of a shift register unit provided in embodiments of the present disclosure.

The technical solutions in the embodiments of the present disclosure will be described clearly and completely with reference to the accompanying drawings in the embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

In the prior art, the GOA circuit includes a plurality of cascaded shift register units, and an output terminal of each of the shift register units is coupled to a gate line for inputting gate driving signals to the gate line. A signal of an output terminal of a previous stage of shift register unit is used as an input signal of a next stage of shift register unit. In this case, the next stage of shift register unit may cause loss of the gate scanning signal output by the previous stage of shift register unit, thereby lowering the stability of the gate scanning signal. Thus, the display effect may become worse.

Embodiments of the present disclosure provide a shift register unit, and a method for controlling the same, a gate driving circuit, and a display device, which may reduce the probability of the effect of a next stage of shift register unit on a gate scanning signal output by a previous stage of shift register unit in the GOA circuit.

For solving the problem above, embodiments of the present disclosure provide a shift register unit, and a method for controlling the same, a gate driving circuit, and a display device. The shift register unit includes a shift drive sub-circuit, a pull-down sub-circuit and an output sub-circuit. The shift drive sub-circuit is coupled to a signal input terminal, a first clock signal terminal, a second clock signal terminal and a first signal output terminal. The shift drive sub-circuit is configured to store a voltage of the signal input terminal under a control of the first clock signal terminal, or to output a voltage of the second clock signal terminal to the first signal output terminal under a control of the signal input terminal, the first clock signal terminal, and the second clock signal terminal. The output sub-circuit is coupled to the first signal output terminal, a first voltage terminal and a second signal output terminal. The output sub-circuit is configured to output a voltage of the first voltage terminal to the second signal output terminal under a control of the first signal output terminal. The pull-down sub-circuit is coupled to the first clock signal terminal, a second voltage terminal, a third voltage terminal, the first signal output terminal and the second signal output terminal. The pull-down sub-circuit is configured to pull down voltages of the first signal output terminal and the second signal output terminal to the second voltage terminal and the third voltage terminal respectively under the control of the first clock signal terminal. An amplitude of a voltage output from the second voltage terminal is higher than an amplitude of a voltage output from the third voltage terminal.

It will be seen from the description above that the shift register unit provided in the embodiments of the present disclosure has a first signal output terminal and a second signal output terminal. In the case of adopting a plurality of cascaded shift register units to form a gate driving circuit, the first signal output terminal of a previous stage of shift register unit is coupled with a signal input terminal of a next stage of shift register unit. Besides, the second signal output terminal of each stage of shift register unit is configured to be coupled with a gate line, so as to output a gate scanning signal to the gate line. In this way, on the one hand, the second signal output terminal of each shift register unit does not need to be coupled with the next stage of shift register unit; therefore the gate scanning signal output from the second signal output terminal will not be affected by the next stage of shift register unit. Consequently, the gate scanning signal output from the shift register unit may be stabilized, with low loss. On the other hand, the pull-down sub-circuit of the above shift register unit is coupled to two kinds of voltages, i.e., the second voltage terminal and the third voltage terminal respectively. Since the amplitude of the voltage output from the second voltage terminal is higher than the amplitude of the voltage output from the third voltage terminal, the voltage of the first signal output terminal may be sufficiently pulled down by the second voltage terminal. Thus, when the shift register unit is in a non-output period, i.e. a period of not outputting the gate driving signal, erroneous output will not occur to the first signal output terminal and the second signal output terminal controlled by the first signal output terminal. This may further improve the stability of the gate scanning signal output by the shift register unit.

Based on this, embodiments of the present application provide a shift register unit, as shown in FIG. 1, including a shift drive sub-circuit 10, a pull-down sub-circuit 20 and an output sub-circuit 30.

The shift drive sub-circuit 10 is coupled to a signal input terminal INPUT, a first clock signal terminal CLK1, a second clock signal terminal CLK2 and a first signal output terminal CR. The shift drive sub-circuit 10 is configured to store a voltage of the signal input terminal INPUT under a control of the first clock signal terminal CLK1, or to output a voltage of the second clock signal terminal CLK2 to the first signal output terminal CR under a control of the signal input terminal INPUT, the first clock signal terminal CLK1, and the second clock signal terminal CLK2.

The output sub-circuit 30 is coupled to the first signal output terminal CR, a first voltage terminal VDD and a second signal output terminal OUT. The output sub-circuit 30 is configured to output a voltage of the first voltage terminal VDD to the second signal output terminal OUT under a control of the first signal output terminal CR.

The pull-down sub-circuit 20 is coupled to the first clock signal terminal CLK1, a second voltage terminal VSSL, a third voltage terminal VSS, the first signal output terminal CR and the second signal output terminal OUT. The pull-down sub-circuit 20 is configured to pull down voltages of the first signal output terminal CR and the second signal output terminal OUT to the second voltage terminal VSSL and the third voltage terminal VSS respectively under the control of the first clock signal terminal CLK1.

An amplitude of a voltage output from the second voltage terminal VSSL is higher than an amplitude of a voltage output from the third voltage terminal VSS. For example, the amplitude of the voltage output from the second voltage terminal VSSL may be 10, and the amplitude of the voltage output from the third voltage terminal VSS may be 5.

It will be seen from the description above that the shift register unit provided in the embodiments of the present disclosure has the first signal output terminal CR and the second signal output terminal OUT. In the case, when a plurality of cascaded shift register units are adopted to form a gate driving circuit, the first signal output terminal CR of the previous stage of shift register unit is coupled with the signal input terminal INPUT of the next stage of shift register unit. Besides, the second signal output terminal OUT of each stage of shift register units is configured to be coupled with a gate line, so as to output the gate scanning signal to the gate line. In this way, on the one hand, the second signal output terminal OUT of each shift register unit does not need to be coupled with the next stage of shift register unit; therefore the gate scanning signal output from the second signal output terminal OUT will not be affected by the next stage of shift register unit. Thus, the gate scanning signal output from the shift register unit may be stabilized, with low loss. On the other hand, the pull-down sub-circuit 20 of the above shift register unit is coupled to two kinds of voltages, i.e., the second voltage terminal VSSL and the third voltage terminal VSS respectively. Since the amplitude of the voltage output from the second voltage terminal VSSL is higher than the amplitude of the voltage output from the third voltage terminal VSS, the voltage of the first signal output terminal CR may be sufficiently pulled down by the second voltage terminal VSSL. Thus, when the shift register unit is in a non-output period, i.e. a period of not outputting the gate driving signal, erroneous output will not occur to the first signal output terminal CR and the second signal output terminal OUT controlled by the first signal output terminal CR. This may further improve the stability of the gate scanning signal output by the shift register unit.

Figure 2:
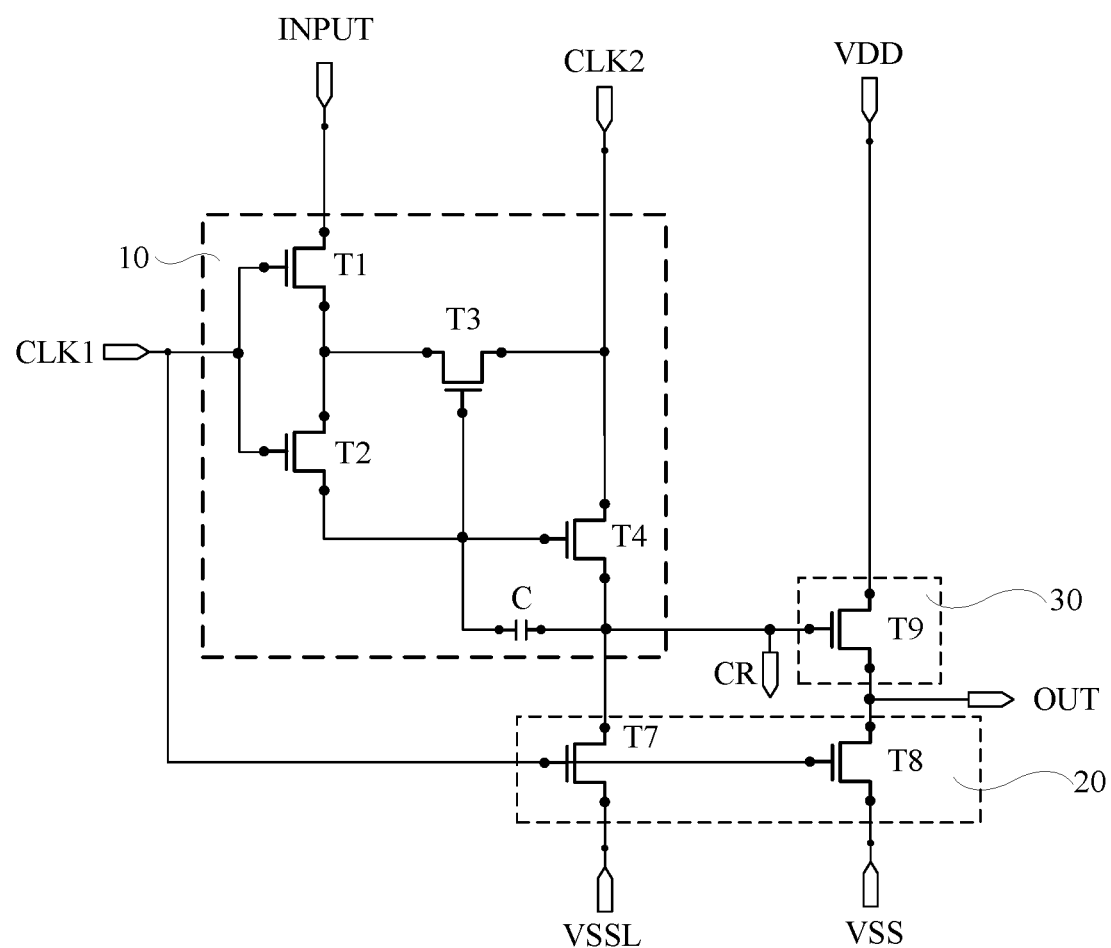
FIG. 2 is a schematic diagram illustrating a specific structure of each of the sub-circuits in FIG. 1.

Optionally, the structure of the above shift drive sub-circuit 10, as shown in FIG. 2, may include a first transistor T1, a second transistor T2, a third transistor T3, a fourth transistor T4 and a capacitor C.

A gate of the first transistor T1 is coupled to the first clock signal terminal CLK1, a first electrode of the first transistor T1 is coupled to the signal input terminal INPUT, and a second electrode of the first transistor T1 is coupled to a second electrode of the second transistor T2.

A gate of the second transistor T2 is coupled to the first clock signal terminal CLK1, and a first electrode of the second transistor T2 is coupled to a gate of the fourth transistor T4.

A gate of the third transistor T3 is coupled to the gate of the fourth transistor T4, a first electrode of the third transistor T3 is coupled to the second clock signal terminal CLK2, and a second electrode of the third transistor T3 is coupled to the second electrode of the first transistor T1.

A first electrode of the fourth transistor T4 is coupled to the second clock signal terminal CLK2, and a second electrode of the fourth transistor T4 is coupled to the first signal output terminal CR.

One end of the capacitor C is coupled to the gate of the fourth transistor T4, and another end of the capacitor C is coupled to the second electrode of the fourth transistor T4.

Figure 3:
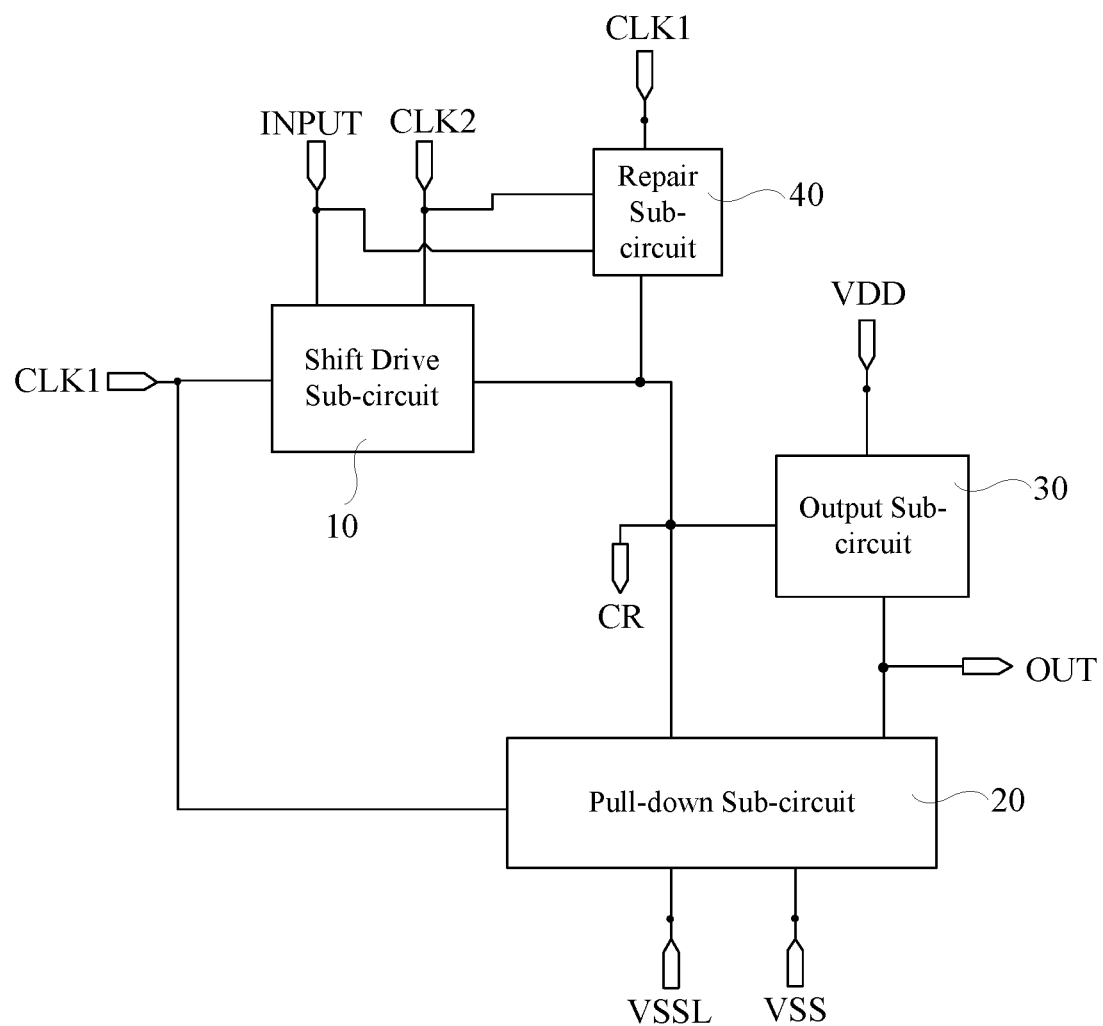
FIG. 3 is a schematic structural diagram of another shift register unit provided in embodiments of the present disclosure.

On this basis, in order to avoid an abnormality of any one of the transistors in the shift drive sub-circuit 10 to disable the shift drive sub-circuit, optionally, as shown in FIG. 3, the shift drive sub-circuit provided in embodiments of the present disclosure further includes a repair sub-circuit 40.

The repair sub-circuit is coupled to the signal input terminal INPUT, the first clock signal terminal CLK1, the second clock signal terminal CLK2 and the first signal output terminal CR. The repair sub-circuit 40 is configured to output a voltage of the second clock signal terminal CLK2 to the first signal output terminal CR under a control of the signal input terminal INPUT, the first clock signal terminal CLK1 and the second clock signal terminal CLK2.

In this way, when an abnormality occurs to any one of the transistors in the shift drive sub-circuit 10 to disable the shift drive sub-circuit 10, the repair sub-circuit 40 may replace the shift drive sub-circuit 10. Under the control of the signal input terminal INPUT, the first clock signal terminal CLK1 and the second clock signal terminal CLK2, the voltage of the second clock signal terminal CLK2 is output to the first signal output terminal CR, so that the output sub-circuit 30 may normally receive the signal output via the first signal output terminal CR. Under the control of the first signal output terminal CR, a voltage of the first voltage terminal VDD is output to the second signal output terminal OUT, so as to output the gate scanning signal to a gate line coupled with the second signal output terminal OUT.

Figure 4:
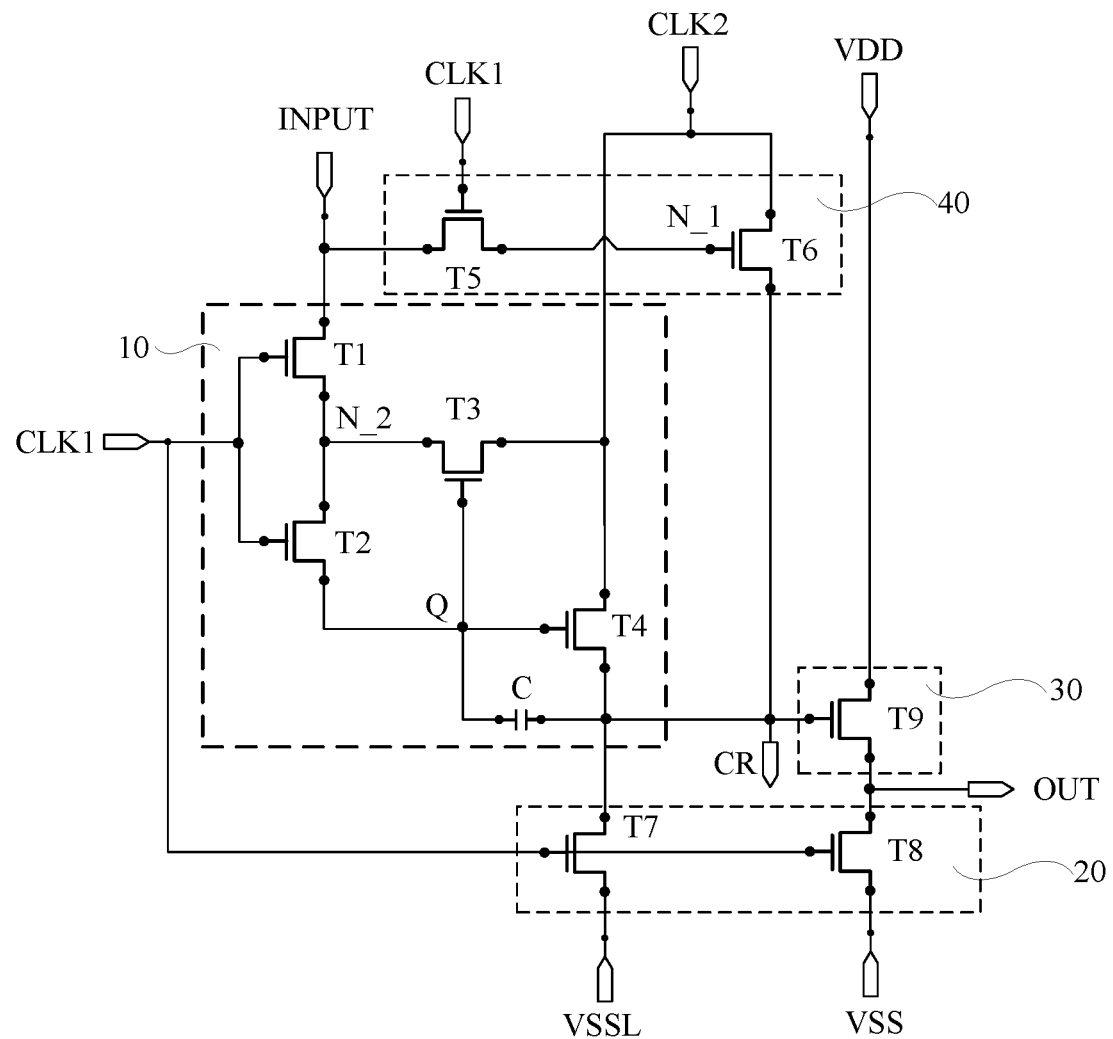
FIG. 4 is a schematic diagram illustrating a specific structure of each of the sub-circuits in FIG. 3.

In some embodiments, the repair sub-circuit, as shown in FIG. 4, includes a fifth transistor T5 and a sixth transistor T6.

A gate of the fifth transistor T5 is coupled to the first clock signal terminal CLK1, a first electrode of the fifth transistor T5 is coupled to the signal input terminal INPUT, and a second electrode of the fifth transistor T5 is coupled to a gate of the sixth transistor T6.

A first electrode of the sixth transistor T6 is coupled to the second clock signal terminal CLK2, and a second electrode of the sixth transistor T6 is coupled to the first signal output terminal CR.

In addition, in a case where the shift drive sub-circuit 10 includes the fourth transistor T4, a width to length ratio of each of the fifth transistor T5 and the sixth transistor T6 is 18% to 22% or approximately 18% to 22% of a width to length ratio of the fourth transistor T4. The word "approximately" means that the value may be allowed to fluctuate 10 or other percent, which is determined according to actual requirements. In this way, since the width to length ratios of the fifth transistor T5 and the sixth transistor T6 are large, they themselves have a certain parasitic capacitance. In a case where the shift register unit is required to output a gate scanning signal, the parasitic capacitance above may keep the sixth transistor T6 in an on-state, so that the signal output to the first signal output terminal CR via the sixth transistor T6 may be kept stable. The inventor of the present disclosure did experiments on the condition that the width to length ratio of each of the fifth transistor T5 and the sixth transistor T6 is 18%, 20%, and 22% of the width to length ratio of the fourth transistor T4. Experimental results proved that the above parasitic capacitance may keep the sixth transistor T6 in an on-state, so that the signal output to the first signal output terminal CR through the sixth transistor T6 may be kept stable.

In addition, as shown in FIG. 2 or FIG. 4, the pull-down sub-circuit 20 includes a seventh transistor T7 and a eighth transistor T8.

A gate of the seventh transistor T7 is coupled to the first clock signal terminal CLK1, a first electrode of the seventh transistor T7 is coupled to the first signal output terminal CR, and a second electrode of the seventh transistor T7 is coupled to the second voltage terminal VSSL.

A gate of the eighth transistor T8 is coupled to the first clock signal terminal CLK1, a first electrode of the eighth transistor T8 is coupled to the second signal output terminal OUT, and a second electrode of the eighth transistor T8 is coupled to the third voltage terminal VSS.

The output sub-circuit 30 includes a ninth transistor T9, a gate of the ninth transistor T9 is coupled to the first signal output terminal CR, a first electrode of the ninth transistor T9 is coupled to the first voltage terminal VDD, and a second electrode of the ninth transistor T9 is coupled with the second signal output terminal OUT. Width to length ratios of the ninth transistor T9 and the fourth transistor T4 are roughly the same, and the ninth transistor and the fourth transistor can both be used as driving transistors.

It is noted that the transistors above may be N-type transistors or P-type transistors. When all the above transistors are N-type transistors, the first electrodes of the above transistors are drains, and the second electrodes thereof are sources. When all the above transistors are P-type transistors, the first electrodes of the above transistors are sources, and the second electrodes thereof are drains.

On this basis, in a case where the transistors in the display area coupled to the shift register unit are N-type transistors, a positive voltage of, e.g. 10 V is output from the first voltage terminal VDD above. In a case where the transistors in the display area coupled to the shift register unit are P-type transistors, a negative voltage of, e.g. −10 V is output from the first voltage terminal VDD above.

In addition, voltages of signals output from the first clock signal terminal CLK1 and the second clock signal terminal CLK2 are in the same amplitude, with opposite directions. For example, amplitudes of the voltages of the first clock signal terminal CLK1 and the second clock signal terminal CLK2 at the peak may be 15, and amplitudes of the voltages thereof at the valley may be −15.

Figure 5:
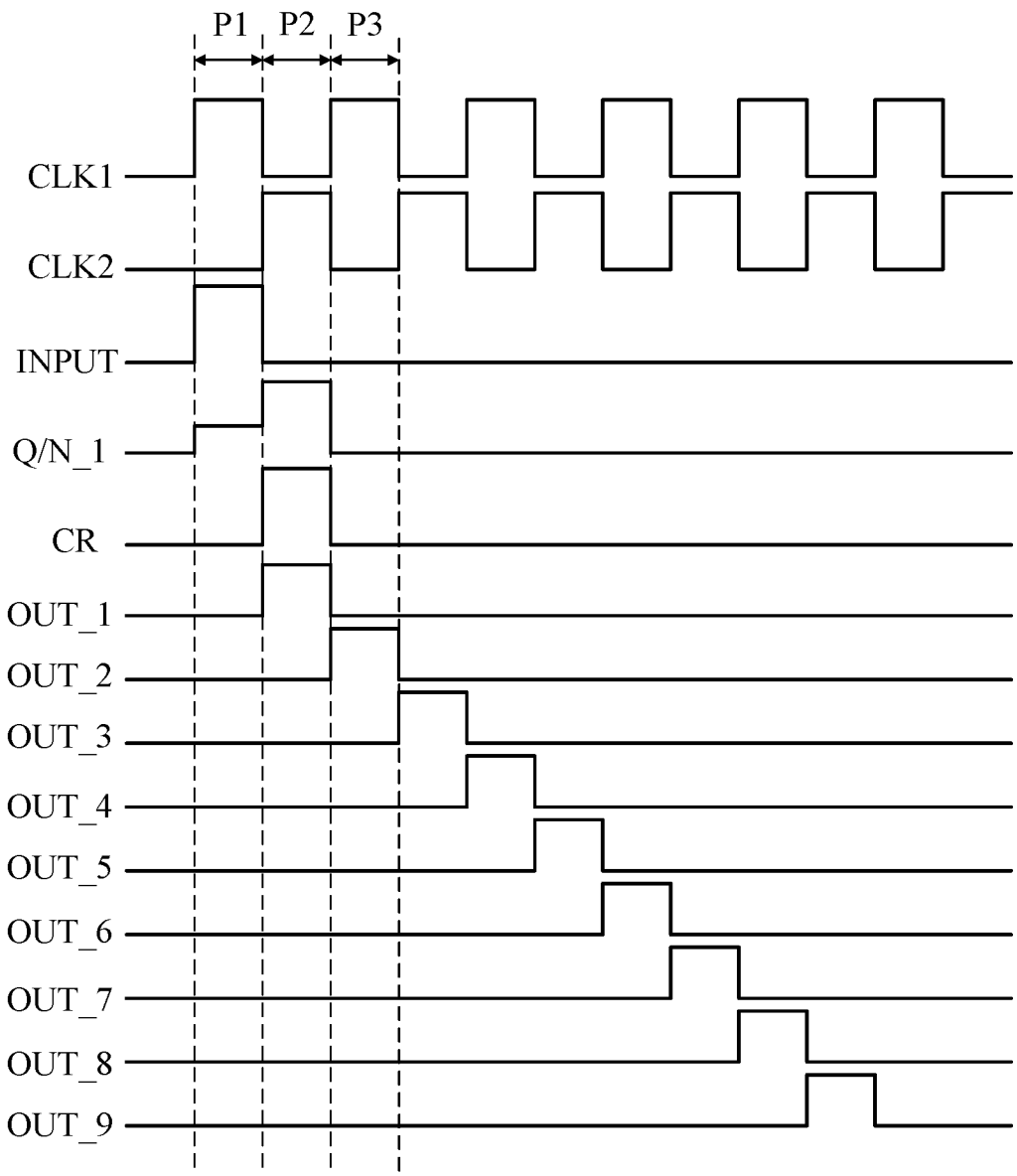
FIG. 5 is a diagram illustrating timing of each of control signals for driving the shift register unit shown in FIG. 4.

Hereinafter, a method for driving the shift register unit as shown in FIG. 4 will be described in detail with reference to the signal timing diagram as shown in FIG. 5. The following description is all illustrated by taking an example in which the transistors in the shift register unit and the transistors in the display area coupled to the shift register unit are all N-type transistors. At this time, a positive voltage of, e.g. 10 V is output from the first voltage terminal VDD, a negative voltage of, e.g. −10 V is output from the second voltage terminal VSSL, and a negative voltage of, e.g. −5 V is output from the third voltage terminal VSS.

One image frame, as shown in FIG. 5, includes a first period P1, a second period P2 and a third period P3. In the above one image frame, the on-off situation of each of the transistors in FIG. 4 is as follows.

In the first period P1, CLK1=1, CLK2=0, INTPUT=1, CR=0, and OUT=0, wherein '1' represents a high level, and '0' represents a low level.

In this case, a high level is output from the first clock signal terminal CLK1, and the first transistor T1, the second transistor T2, the seventh transistor T7 and the eighth transistor T8 are turned on. The high level output from the signal input terminal INPUT is output via the first transistor T1 and the second transistor T2 to the capacitor C, and the above high level is stored through the capacitor C.

In addition, the fifth transistor T5 is turned on to transmit the high level output from the signal input terminal INPUT to the gate of the sixth transistor T6. The sixth transistor T6 is turned on, and the low level output from the second clock signal terminal CLK2 is output to the first signal output terminal CR via the sixth transistor T6.

On this basis, the voltage of the first signal output terminal CR is pulled down to that of the second voltage terminal VSSL via the seventh transistor T7, so as to reset the voltage of the first signal output terminal CR. Based on this, the ninth transistor T9 is in a cut-off state. A voltage of the second signal output terminal OUT is pulled down to that of the third voltage terminal VSS via the eighth transistor T8, so as to reset the voltage of the second signal output terminal OUT.

In addition, although the third transistor T3 and the fourth transistor T4 can be turned on, a potential of the first signal output terminal CR will not be affected since a low level is output from the second clock signal terminal CLK2 in this period.

In conclusion, the first period P1 is a reset period of the shift register unit, for resetting the voltages of the first signal output terminal CR and the second signal output terminal OUT, so as to prevent residual voltages of the above two output terminals of the previous image frame from producing an influence on the display of the present image frame.

In the second period P2, CLK1=0, CLK2=1, INTPUT=0, CR=1, and OUT=1.

In this case, a low level is output from the first clock signal terminal CLK1, and the first transistor T1, the second transistor T2, the seventh transistor T7 and the eighth transistor T8 are cut off. Under the action of releasing, by the capacitor C, the high level stored during the first period P1, the fourth transistor T4 is turned on, and the high level output from the second clock signal terminal CLK2 is output to the first signal output terminal CR. In this case, the ninth transistor T9 is turned on, and the high level of the first voltage terminal VDD is output to the second signal output terminal OUT via the ninth transistor T9, so that a gate line coupled with the second signal output terminal OUT receives a gate scanning signal.

In addition, under the action of its own parasitic capacitance, the sixth transistor T6 enables the potential of the node N_1 to be further increased, thereby ensures that the sixth transistor T6 is kept in a turn-on state, so that the high level output from the second clock signal terminal CLK2 is output to the first signal output terminal CR via the sixth transistor T6. In this situation, the potential of the node Q is further increased through the coupling of the capacitor C.

Based on this, the third transistor T3 is kept in a turn-on state, so that the high level output from the second clock signal terminal CLK2 is output to the node N_2 (i.e. the source of the second transistor T2) via the third transistor T3, thereby the source of the second transistor T2 may be prevented from being in a floating state. In this situation, a gate-source voltage of the second transistor T2 Vgs=CLK1−CLK2. Since a low level of, e.g. −15 V is input via CLK1 and a high level of, e.g. 15 V is input via CLK2 at this moment, the above Vgs=−30 V<0 V. Thereby, it may be ensured that the second transistor T2 is in a good cut-off state, which reduces the leak current of the second transistor T2 in the period, and thereby reduces the risk that the leak current makes the potential of the node Q lower. In this case, the node Q may be stably kept in a high level, which ensures that the fourth transistor T4 may be kept in a stable turn-on state, such that a stable high level may be output from the first signal output terminal CR. In this situation, the voltage of the first voltage terminal VDD may be output via the second signal output terminal OUT in full swing, which may reduce the power consumption and improve the stability of the shift register unit.

In conclusion, the high level is output from both of the first signal output terminal CR and the second signal output terminal OUT in this period. Therefore, the above period is an output period of the shift register unit, which is configured to provide a gate scanning signal to the gate line coupled with the shift register unit.

In the third period P3, CLK1=1, CLK2=0, INTPUT=0, CR=0, and OUT=0

In this case, a high level is output from the first clock signal terminal CLK1 to turn on the seventh transistor T7 and the eighth transistor T8, so that the voltage of the first signal output terminal CR may be pulled down to that of the second voltage terminal VSSL via the seventh transistor T7, and the voltage of the second signal output terminal OUT may be pulled down to the third voltage terminal VSS via the eighth transistor T8. Thereby the first signal output terminal CR and the second signal output terminal OUT may be reset.

In conclusion, the third period P3 is a reset period of the shift register unit. In addition, before the next image frame arrives, in a case where a high level is output from the first clock signal terminal CLK1, the shift register unit repeats the above third period P3.

From the above description it will be seen that the shift register unit only outputs a gate scanning signal in the second period P2, so all the rest time within one image frame except the above second period P2 is the non-output period of the shift register unit.

In addition, the amplitude of the voltage output from the above second voltage terminal VSSL is higher than the amplitude of the voltage output from the third voltage terminal VSS. Therefore, under the effect of the seventh transistor T7, the voltage of the first signal output terminal CR may be sufficiently pulled down by the second voltage terminal VSSL. Thus, when the shift register unit is in the non-output period, erroneous output will not occur to the first signal output terminal CR and the second signal output terminal OUT controlled by the first signal output terminal CR. This may further improve the stability of the gate scanning signal output by the shift register unit.

Figure 6:
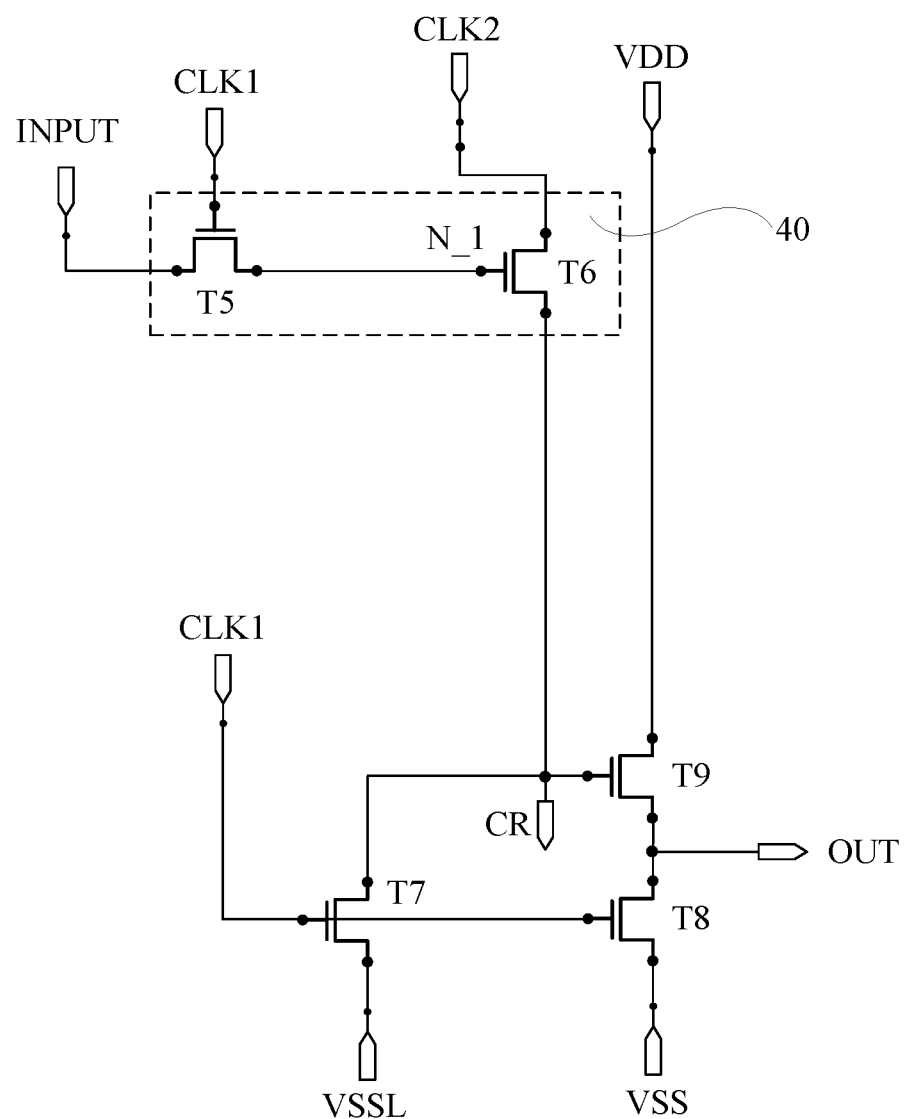
FIG. 6 is a schematic structural diagram of a shift register unit obtained after the shift drive sub-circuit in FIG. 4 is isolated.

It is noted that, in a case where any one of the components in the shift drive sub-circuit 10 is abnormal in embodiments of the present disclosure, the shift register unit may isolate the shift drive sub-circuit 10. In this situation, as shown in FIG. 6, the shift drive sub-circuit 10 may be replaced by a repair sub-circuit 40 composed of the fifth transistor T5 and the sixth transistor T6. The on-off state of the repair sub-circuit 40 in the three periods as shown in FIG. 5 is as described above, and will not be elaborated here.

In addition, the shift drive sub-circuit 10 in embodiments of the present disclosure can exist in the shift register unit simultaneously with the repair sub-circuit 40, and after an abnormality occurs in the shift drive sub-circuit 10, the repair sub-circuit 40 automatically operates in place of the shift driving sub-circuit 10. Alternatively, during the process of fabrication of a product, the repair sub-circuit 40 is first isolated from the shift drive sub-circuit 10 to avoid interference between the two sub-circuits. After the abnormality occurs in the shift driving sub-circuit 10, the repair sub-circuit 40 is electrically connected to the signal input terminal INPUT, the first clock signal terminal CLK1, the second clock signal terminal CLK2, and the first signal output terminal CR through coated metal wires, so that the repair sub-circuit 40 may operate in place of the shift drive sub-circuit 10.

A width to length ratio of the sixth transistor T6 in the repair sub-circuit 40 is 18% to 22% or approximately 18% to 22% of a width to length ratio of the fourth transistor. Therefore, in the above second period P2, the sixth transistor T6 may further improve the potential of the node N_1 through the parasitic capacitance of its own, as shown in FIG. 5, so as to ensure that the sixth transistor T6 is kept in a stable turn-on state.

Certainly, the above description is all illustrated by taking an example in which the transistors in the shift register unit and the transistors in the display area coupled to the shift register unit are all N-type transistors. In a case where the transistors in the shift register unit and the transistors in the display area coupled to the shift register unit are all P-type transistors, the method for controlling the shift register unit is the same as above. In addition, some of the control signals in FIG. 5 need to be inverted.

Figure 7:
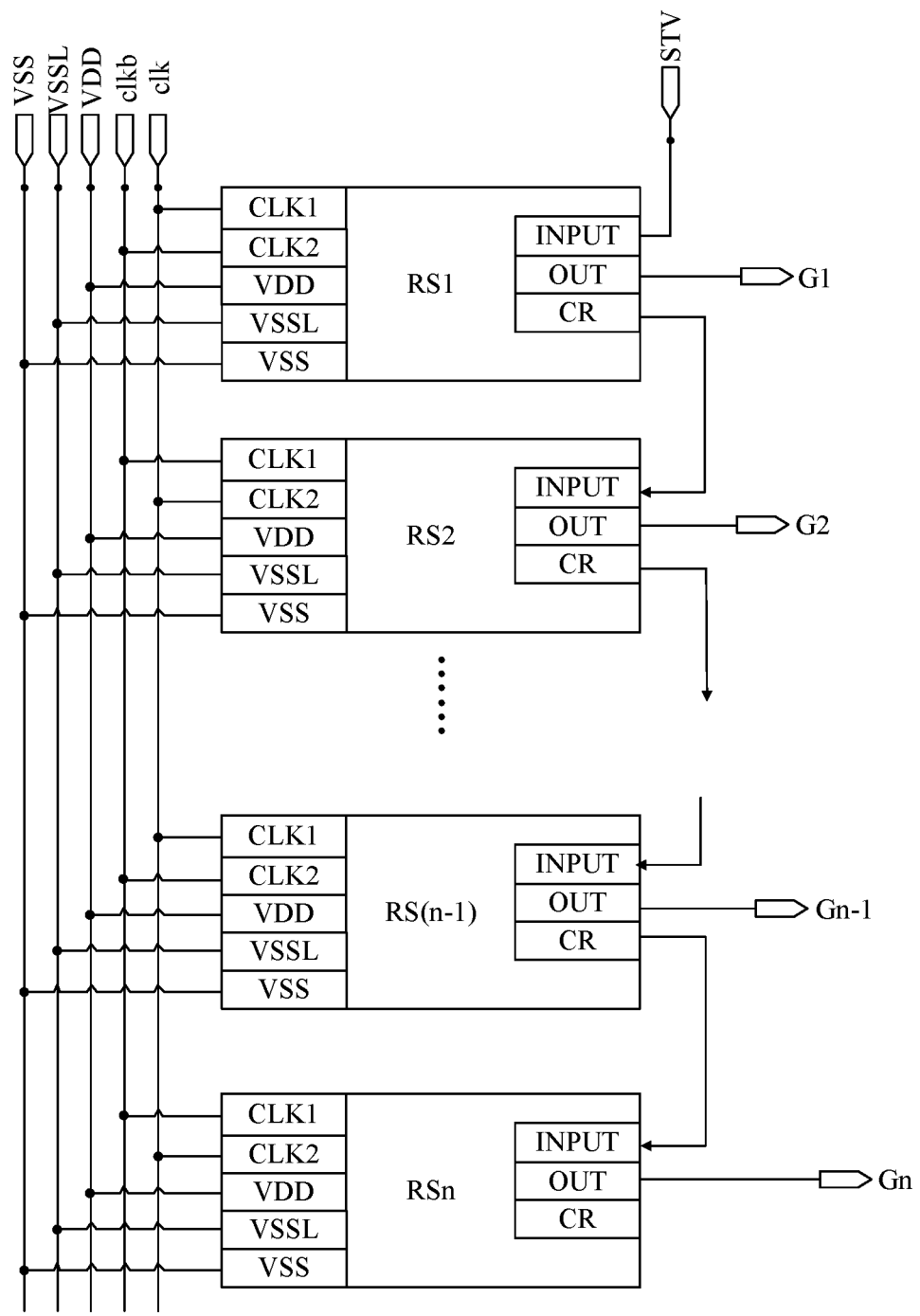
FIG. 7 is a schematic structural diagram of a gate driving circuit formed by a plurality of cascaded shift register units shown in FIG. 4.

Embodiments in the present disclosure provide a gate driving circuit, as shown in FIG. 7, including a plurality of stages of shift register units (RS1, RS2 . . . RSn) described above. The above plurality of stages of shift register units (RS1, RS2 . . . RSn) scan the gate lines (G1, G2 . . . Gn)

successively via the respective second signal output terminals OUT. FIG. 5 shows the gate scanning signals (OUT1, OUT2 . . . OUT9) received by the first to ninth gate lines successively.

A signal input terminal of a first stage of shift register unit RS1 is coupled to a start signal terminal STV.

It is noted that in a case where the transistors in the shift register unit are all N-type transistors, a high level of, e.g. 15 V, is output from the start signal terminal STV. In a case where the transistors in the shift register unit are all P-type transistors, a low level of, e.g. −15 V, is output from the start signal terminal STV.

On this basis, except the first stage of shift register unit RS1, a first signal output terminal CR of a previous stage of shift register unit is coupled to a signal input terminal INPUT of a next stage of shift register unit. A first signal output terminal CR of the last stage of shift register unit RSn may be vacant.

It is noted that in order to enable the signals output from the first clock signal input terminal CLK1 and the second clock signal input terminal CLK2 of each stage of shift register units to have a same frequency and amplitude as the waveform shown in FIG. 5, but have an opposite phase therewith, first clock signal input terminals CLK1 and second clock signal input terminals CLK2 of two adjacent stages of shift register units, as shown in FIG. 7, may be alternately coupled to a first system clock signal input terminal clk and a second system clock signal input terminal clkb. For example, the first clock signal input terminal CLK1 of the first stage of shift register unit RS1 is coupled to the first system clock signal input terminal clk, and the second clock signal input terminal CLK2 thereof is coupled to the second system clock signal input terminal clkb; the first clock signal input terminal CLK1 of the second stage of shift register unit RS2 is coupled to the second system clock signal input terminal clkb, and the second clock signal input terminal CLK2 thereof is coupled to the first system clock signal input terminal clk. The coupling methods of the following shift register units are the same as described above, and will not be elaborated here.

Embodiments of the present disclosure provide a display device, including the gate driving circuit as described above. The display device has the same beneficial effects as the gate driving circuit described above, and the effects will not be elaborated here.

In embodiments of the present disclosure, the display device may include a liquid crystal display device. For example, the display device may be any one of products or components having a display function, such as a liquid crystal display (LCD), a liquid crystal television, a digital photo frame, a mobile phone or a tablet computer.

Embodiments of the present disclosure provide a method for driving any one of the above shift register units. In one image frame, the method includes following periods.

In the first period P1 as shown in FIG. 5, the shift drive sub-circuit 10 in FIG. 1 stores a voltage of the signal input terminal INPUT under the control of the first clock signal terminal CLK1. In a case where the structure of the shift drive sub-circuit 10 is as shown in FIG. 2 or FIG. 4, the voltage of the signal input terminal INPUT may be stored through the capacitor C.

Based on this, the pull-down sub-circuit 20 pulls down the voltages of the first signal output terminal CR and the second signal output terminal OUT to the second voltage terminal VSSL and the third voltage terminal VSS respectively under the control of the first clock signal terminal CLK1. The amplitude of the voltage output from the second voltage terminal VSSL is higher than the amplitude of the voltage output from the third voltage terminal VSS.

In a case where the structure of the pull-down sub-circuit 20 is as shown in FIG. 2 or FIG. 4, on-off states and functions of the seventh transistor T7 and the eighth transistor T8 in the pull-down sub-circuit 20 during this period are the same as described above, and will not be elaborated here.

In the second period P2 as shown in FIG. 5, the shift drive sub-circuit 10 outputs a voltage of the second clock signal terminal CLK2 to the first signal output terminal CR under the control of the signal input terminal INPUT, the first clock signal terminal CLK1 and the second clock signal terminal CLK2.

The output sub-circuit 30 outputs a voltage of the first voltage terminal VDD to the second signal output terminal OUT under the control of the first signal output terminal CR.

In a case where structures of the shift drive sub-circuit 10 and the output sub-circuit 30 are as shown in FIG. 2 or FIG. 4, an on-off state and function of each of transistors in the shift drive sub-circuit 10 and the output sub-circuit 30 are as described above, and will not be elaborated here.

In the third period P3 as shown in FIG. 5, the pull-down sub-circuit 20 pulls down voltages of the first signal output terminal CR and the second signal output terminal OUT to the second voltage terminal VSSL and the third voltage terminal VSS respectively.

In a case where a structure of the pull-down sub-circuit 20 is as shown in FIG. 2 or FIG. 4, an on-off state and function of each of transistors in the pull-down sub-circuit 20 are as described above, and will not be elaborated here.

It is noted that the above method for driving the shift register unit has the same beneficial effects as the shift register unit provided in the preceding embodiments, and the effects will not be elaborated here.

In addition, in a case where the shift register unit, as shown in FIG. 3, further includes a repair sub-circuit 40, in the above second period, the driving method further includes: outputting, by the repair sub-circuit 40, a voltage of the second clock signal terminal CLK2 to the first signal output terminal CR under the control of the signal input terminal INPUT, the first clock signal terminal CLK1 and the second clock signal terminal CLK2. In a case where a structure of the repair sub-circuit 40 is as shown in FIG. 4, an on-off state and function of each of transistors in the repair sub-circuit 40 are as described above, and will not be elaborated here.

In this way, when an abnormality occurs to any one of the transistors in the shift drive sub-circuit 10 to disable the shift drive sub-circuit 10, the repair sub-circuit 40 may replace the shift drive sub-circuit 10 to output the voltage of the second clock signal terminal CLK2 to the first signal output terminal CR. Thus, the output sub-circuit 30 can normally receive the signal output from the first signal output terminal CR, and output the voltage of the first voltage terminal VDD to the second signal output terminal OUT under the control of the first signal output terminal CR, so as to output the gate scanning signal to the gate line coupled with the second signal output terminal OUT.

The above embodiments are merely specific embodiments of the present disclosure, but the protection scope of the present disclosure is not limited thereto. Any person skilled in the art could readily conceive of changes or replacement within the technical scope of the present disclosure, which should all be included in the protection scope of the present disclosure. Therefore, the protection scope of the present disclosure should be determined by the protection scope of the claims.

Additional embodiments may be provided in the present disclosure. These additional embodiments may include any one of the above embodiments, and one or more of the components, functions, or structures in the additional embodiments may be replaced or supplemented by one or more of the components, functions, or structures in the above embodiments.

What is claimed is:

1. A shift register unit, comprising a shift drive sub-circuit, a pull-down sub-circuit and an output sub-circuit, wherein
    the shift drive sub-circuit is coupled to a signal input terminal, a first clock signal terminal, a second clock signal terminal and a first signal output terminal, and the shift drive sub-circuit is configured to store a voltage of the signal input terminal under a control of the first clock signal terminal, or to output a voltage of the second clock signal terminal to the first signal output terminal under a control of the signal input terminal, the first clock signal terminal, and the second clock signal terminal;
    the output sub-circuit is coupled to the first signal output terminal, a first voltage terminal and a second signal output terminal, and the output sub-circuit is configured to output a voltage of the first voltage terminal to the second signal output terminal under a control of the first signal output terminal;
    the pull-down sub-circuit is coupled to the first clock signal terminal, a second voltage terminal, a third voltage terminal, the first signal output terminal and the second signal output terminal, and the pull-down sub-circuit is configured to pull down voltages of the first signal output terminal and the second signal output terminal to the second voltage terminal and the third voltage terminal respectively under the control of the first clock signal terminal; and an amplitude of a voltage output from the second voltage terminal is higher than an amplitude of a voltage output from the third voltage terminal; and
    the shift register unit is configured to output a signal to a next-stage of shift register unit via the first signal output terminal, and to output a gate scanning signal via the second signal output terminal.

2. The shift register unit according to claim 1, wherein the shift drive sub-circuit comprises a first transistor, a second transistor, a third transistor, a fourth transistor and a capacitor;
    a gate of the first transistor is coupled to the first clock signal terminal, a first electrode of the first transistor is coupled to the signal input terminal, and a second electrode of the first transistor is coupled to a second electrode of the second transistor;
    a gate of the second transistor is coupled to the first clock signal terminal, and a first electrode of the second transistor is coupled to a gate of the fourth transistor;
    a gate of the third transistor is coupled to the gate of the fourth transistor, a first electrode of the third transistor is coupled to the second clock signal terminal, and a second electrode of the third transistor is coupled to the second electrode of the first transistor;
    a first electrode of the fourth transistor is coupled to the second clock signal terminal, and a second electrode of the fourth transistor is coupled to the first signal output terminal;
    one end of the capacitor is coupled to the gate of the fourth transistor, and another end of the capacitor is coupled to the second electrode of the fourth transistor.

3. The shift register unit according to claim 2, further comprising a repair sub-circuit, wherein the repair sub-circuit is coupled to the signal input terminal, the first clock signal terminal, the second clock signal terminal and the first signal output terminal; the repair sub-circuit is configured to output a voltage of the second clock signal terminal to the first signal output terminal under a control of the signal input terminal, the first clock signal terminal and the second clock signal terminal.

4. The shift register unit according to claim 3, wherein the repair sub-circuit comprises a fifth transistor and a sixth transistor;
    a gate of the fifth transistor is coupled to the first clock signal terminal, a first electrode of the fifth transistor is coupled to the signal input terminal, and a second electrode of the fifth transistor is coupled to a gate of the sixth transistor;
    a first electrode of the sixth transistor is coupled to the second clock signal terminal, and a second electrode of the sixth transistor is coupled to the first signal output terminal;
    in a case where the shift drive sub-circuit comprises the fourth transistor, a width to length ratio of each of the fifth transistor and the sixth transistor is 18% to 22% of a width to length ratio of the fourth transistor.

5. The shift register unit according to claim 1, wherein the pull-down sub-circuit comprises a seventh transistor and an eighth transistor;
    a gate of the seventh transistor is coupled to the first clock signal terminal, a first electrode of the seventh transistor is coupled to the first signal output terminal, and a second electrode of the seventh transistor is coupled to the second voltage terminal;
    a gate of the eighth transistor is coupled to the first clock signal terminal, a first electrode of the eighth transistor is coupled to the second signal output terminal, and a second electrode of the eighth transistor is coupled to the third voltage terminal.

6. The shift register unit according to claim 1, wherein the output sub-circuit comprises a ninth transistor, a gate of the ninth transistor is coupled to the first signal output terminal, a first electrode of the ninth transistor is coupled to the first voltage terminal, and a second electrode of the ninth transistor is coupled to the second signal output terminal.

7. A gate driving circuit, comprising a plurality of cascaded shift register units according to claim 1, wherein
    a signal input terminal of a first stage of shift register unit is coupled to a start signal terminal;
    except the first stage of shift register unit, a first signal output terminal of a previous stage of shift register unit is coupled to a signal input terminal of a next stage of shift register unit.

8. A display device, comprising the gate driving circuit according to claim 7.

9. A method for driving the shift register unit according to claim 1, in one image frame, the method comprising:
    in a first period, storing, by the shift drive sub-circuit, a voltage of the signal input terminal under the control of the first clock signal terminal;
    pulling down, by the pull-down sub-circuit, voltages of the first signal output terminal and the second signal output terminal to the second voltage terminal and the third voltage terminal respectively under the control of the first clock signal terminal, wherein an amplitude of a voltage output from the second voltage terminal is higher than an amplitude of a voltage output from the third voltage terminal;

in a second period, outputting, by the shift drive sub-circuit, a voltage of the second clock signal terminal to the first signal output terminal under the control of the signal input terminal, the first clock signal terminal and the second clock signal terminal;

outputting, by the output sub-circuit, a voltage of the first voltage terminal to the second signal output terminal under the control of the first signal output terminal; and in a third period, pulling down, by the pull-down sub-circuit, voltages of the first signal output terminal and the second signal output terminal to the second voltage terminal and the third voltage terminal respectively under the control of the first clock signal terminal.

10. The method according to claim 9, wherein the shift register unit further comprises a repair sub-circuit, in the second period, the method further comprises:
outputting, by the repair sub-circuit, a voltage of the second clock signal terminal to the first signal output terminal under the control of the signal input terminal, the first clock signal terminal and the second clock signal terminal.

11. The shift register unit according to claim 3, wherein the repair sub-circuit comprises a fifth transistor and a sixth transistor;

a gate of the fifth transistor is connected to the first clock signal terminal, a first electrode of the fifth transistor is connected to the signal input terminal, and a second electrode of the fifth transistor is connected to a gate of the sixth transistor;

a first electrode of the sixth transistor is connected to the second clock signal terminal, and a second electrode of the sixth transistor is connected to the first signal output terminal.

12. A gate driving circuit, comprising a plurality of cascaded shift register units according to claim 1.

13. The gate driving circuit according to claim 12, wherein a signal input terminal of a first stage of shift register unit is connected to a start signal terminal;

except the first stage of shift register unit, a first signal output terminal of a previous one of two adjacent stage shift register units is connected to a signal input terminal of a next one of the two adjacent stage shift register units.

14. A display device, comprising:
the gate driving circuit according to claim 12; and
a plurality of gate lines, each of at least one of the plurality of gate lines being coupled to a second signal output terminal of a corresponding shift register unit in the gate driving circuit.

* * * * *